United States Patent
Seino

(10) Patent No.: US 9,929,340 B2
(45) Date of Patent: Mar. 27, 2018

(54) METHOD OF MANUFACTURING PERPENDICULAR MTJ DEVICE

(71) Applicant: CANON ANELVA CORPORATION, Kawasaki-shi (JP)

(72) Inventor: Takuya Seino, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 15/653,702

(22) Filed: Jul. 19, 2017

(65) Prior Publication Data

US 2017/0317274 A1  Nov. 2, 2017

Related U.S. Application Data

(63) Continuation of application No. PCT/JP2015/000446, filed on Feb. 2, 2015.

(51) Int. Cl.
*H01L 43/00* (2006.01)
*H01L 43/12* (2006.01)
*H01L 43/02* (2006.01)
*H01L 43/08* (2006.01)

(52) U.S. Cl.
CPC ............. *H01L 43/12* (2013.01); *H01L 43/02* (2013.01); *H01L 43/08* (2013.01)

(58) Field of Classification Search
None
See application file for complete search history.

(56) References Cited

U.S. PATENT DOCUMENTS

| 9,281,468 B2 | 3/2016 | Min et al. |
| 9,478,731 B2 | 10/2016 | Uchida et al. |
| 2004/0244684 A1 | 12/2004 | Tsunoda et al. |
| 2014/0169085 A1* | 6/2014 | Wang .................... G11C 11/161 365/158 |

(Continued)

FOREIGN PATENT DOCUMENTS

| JP | 2004-235223 A | 8/2004 |
| JP | 2014-072394 A | 4/2014 |

(Continued)

OTHER PUBLICATIONS

"A perpendicular anisotropy of CoFeB—MgO magnetic tunnel injection" by Ikeda et al, Jul. 2010.*

(Continued)

*Primary Examiner* — Everen Seven
(74) *Attorney, Agent, or Firm* — Fitzpatrick, Cella, Harper & Scinto

(57) ABSTRACT

An embodiment of the present invention is a method of manufacturing a perpendicular MTJ device which includes: a first stacked structure including a pair of CoFeB layers sandwiching an MgO layer; and a second stacked structure including a multilayer, the method comprising the steps of: forming one of the first and second stacked structures on a substrate; inspecting a property of the substrate with the one of the first and second stacked structures formed thereon while exposing the substrate to the atmosphere; and forming another one of the first and second stacked structures on the substrate with the one of the first and second stacked structures formed thereon.

3 Claims, 11 Drawing Sheets

(56) References Cited

U.S. PATENT DOCUMENTS

| | | | |
|---|---|---|---|
| 2014/0177327 A1* | 6/2014 | Khalili Amiri | G11C 11/161 365/158 |
| 2015/0318466 A1 | 11/2015 | Shimane et al. | |
| 2016/0005958 A1 | 1/2016 | Seino et al. | |
| 2016/0240772 A1 | 8/2016 | Seino et al. | |
| 2016/0276583 A1 | 9/2016 | Otani et al. | |
| 2016/0380187 A1 | 12/2016 | Seino et al. | |
| 2017/0040044 A1 | 2/2017 | Uchida et al. | |
| 2017/0263854 A1* | 9/2017 | Sato | H01L 43/08 |

FOREIGN PATENT DOCUMENTS

| | | | |
|---|---|---|---|
| JP | 2015-002352 A | 1/2015 | |
| WO | 2014/097510 A1 | 6/2014 | |
| WO | 2016/125200 A1 | 8/2016 | |

OTHER PUBLICATIONS

"The Role of Metrology and Inspection in Semiconductor Processing" by Keefer et al, Feb. 2001.*

International Search Report in International Application No. PCT/JP2015/000446 (dated Apr. 7, 2015).

D. C. Worledge et al., "Spin Torque Switching of Perpendicular Ta | CoFeB | MgOTa | CoFeB | MgO-based Magnetic Tunnel Junctions," 98(2) Appl. Phys. Lett. 98, 022501, pp. 1-3 (2011).

Erratum: "Spin Torque Switching of Perpendicular Ta | CoFeB | MgOTa | CoFeB | MgO-based Magnetic Tunnel Junctions" [Appl. Phys. Lett. 98, 022501 (2011)], 108 Appl. Phys. Lett. 139901-1 (Mar. 2016).

Written Opinion in International Application No. PCT/JP2015/000446 (dated Apr. 7, 2015).

International Preliminary Report on Patentability in International Application No. PCT/JP2015/000446 (Aug. 8, 2017).

* cited by examiner

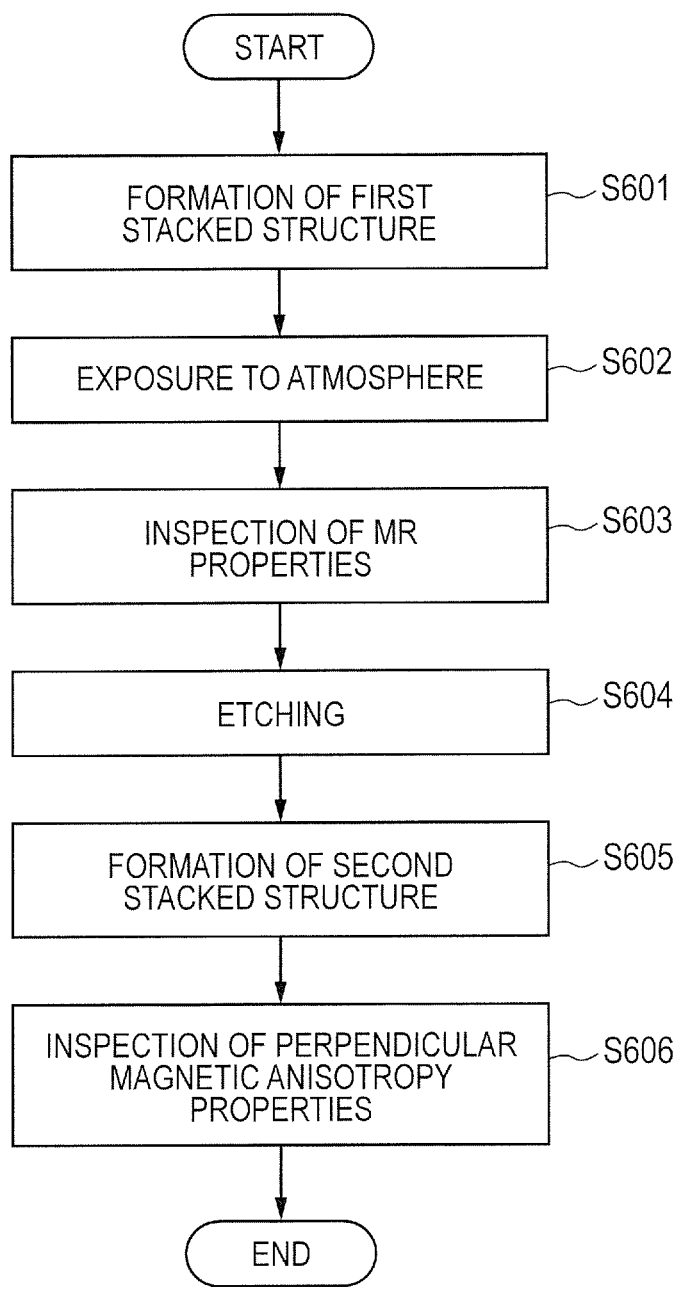

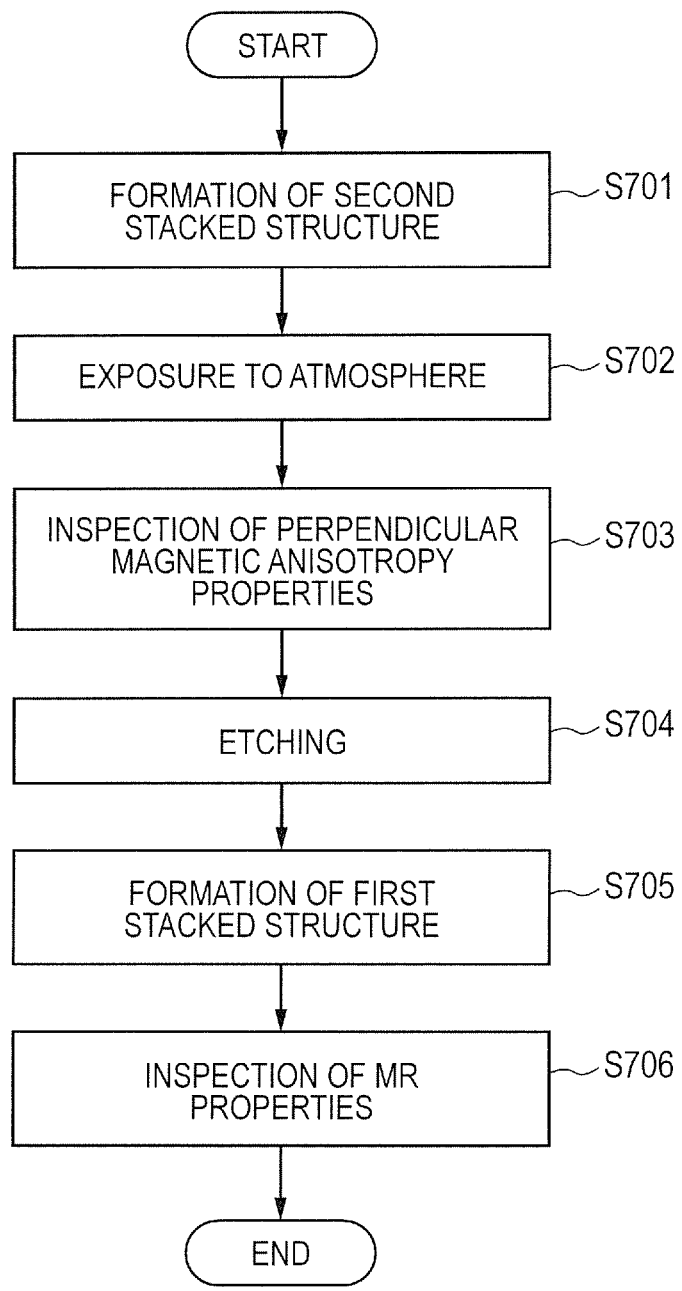

METHOD OF MANUFACTURING PERPENDICULAR MTJ DEVICE

CROSS-REFERENCES TO RELATED APPLICATIONS

This application is a continuation application of International Application No. PCT/JP2015/000446, filed Feb. 2, 2015. The contents of the aforementioned applications are incorporated herein by reference in their entireties.

TECHNICAL FIELD

The present invention relates to a method of manufacturing a perpendicular magnetic tunnel junction (MTJ) device.

BACKGROUND ART

Next-generation spin transfer torque magnetoresistive random access memories (STT-MTRAMs) use perpendicular MTJ devices, the magnetization direction of which is perpendicular to the film surface. Each of layers constituting a perpendicular MTJ device is very thin, and the properties thereof are liable to degrade when the perpendicular MTJ device is exposed to the atmosphere during the process of film formation. In the technique of Non-patent document 1, the entire process is consistently performed under vacuum in order to prevent degradation of the properties of the barrier layer and the perpendicular magnetic anisotropy layer.

At the same time, it is necessary to measure both the magnetoresistance (MR) properties and the perpendicular magnetic properties for management of the process of manufacturing MTJ devices. For this reason, in the technique of Non-patent Document 1, inspection of the MR (magnetoresistance) properties and perpendicular magnetic anisotropy properties is performed for completed perpendicular MTJ devices.

CITATION LIST

Non Patent Document

Non Patent Document 1: D. C. Worledge et al., Appl. Phys. Lett. 98, 022501 (2011)

SUMMARY OF INVENTION

Technical Problem

However, with the conventional method that performs property inspections for completed perpendicular MTJ devices, in the case of trouble such as the case where desired properties are not obtained and the yield is thereby reduced, it is difficult to identify the cause of such a trouble.

Accordingly, in the light of the aforementioned problem, an object of the present invention is to provide a method of manufacturing a perpendicular MTJ device which separately includes a step of inspecting the MR properties and a step of inspecting the perpendicular magnetic anisotropy properties.

Solution to Problem

An embodiment of the present invention is a method of manufacturing a perpendicular MTJ device which includes: a first stacked structure including a pair of CoFeB layers sandwiching an MgO layer; and a second stacked structure including a multilayer, the method comprising the steps of: forming one of the first and second stacked structures on a substrate; inspecting a property of the substrate with the one of the first and second stacked structures formed thereon while exposing the substrate to an atmosphere; and forming an other one of the first and second stacked structures on the substrate with the one of the first and second stacked structures formed thereon.

Advantageous Effects of Invention

With the method of manufacturing a perpendicular MTJ device according to the embodiment of the present invention, the management of the properties of the perpendicular MTJ device can be simplified. Specifically, the method of manufacturing a perpendicular MTJ device separately includes the step of forming the stacked structure influencing the MR properties and the step of forming the stacked structure influencing the perpendicular magnetic anisotropy properties, and separately performs the steps of inspecting the MR properties and perpendicular magnetic anisotropy properties. Accordingly, in the case of trouble such as the case where the desired properties are not obtained, it is possible to easily identify which stacked structure causes the trouble.

BRIEF DESCRIPTION OF DRAWINGS

FIG. 6 is a flowchart according to a method of manufacturing a top-pinned perpendicular MTJ device.
FIG. 7 is a flowchart according to a method of manufacturing a bottom-pinned perpendicular MTJ device.

DESCRIPTION OF EMBODIMENTS

[First Embodiment]

Figure 1A:
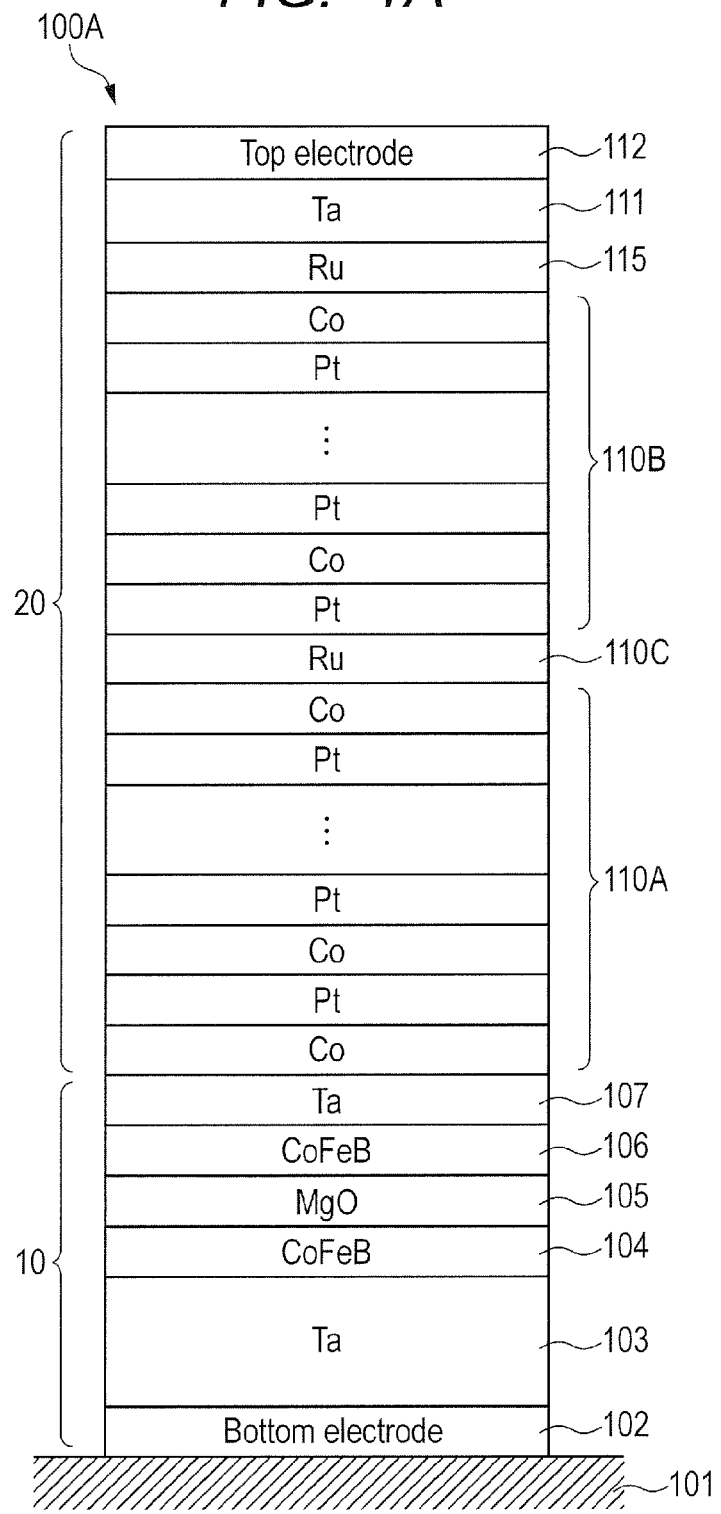
FIG. 1A is a schematic diagram illustrating a layer structure of a top-pinned perpendicular MTJ device.
Figure 1B:
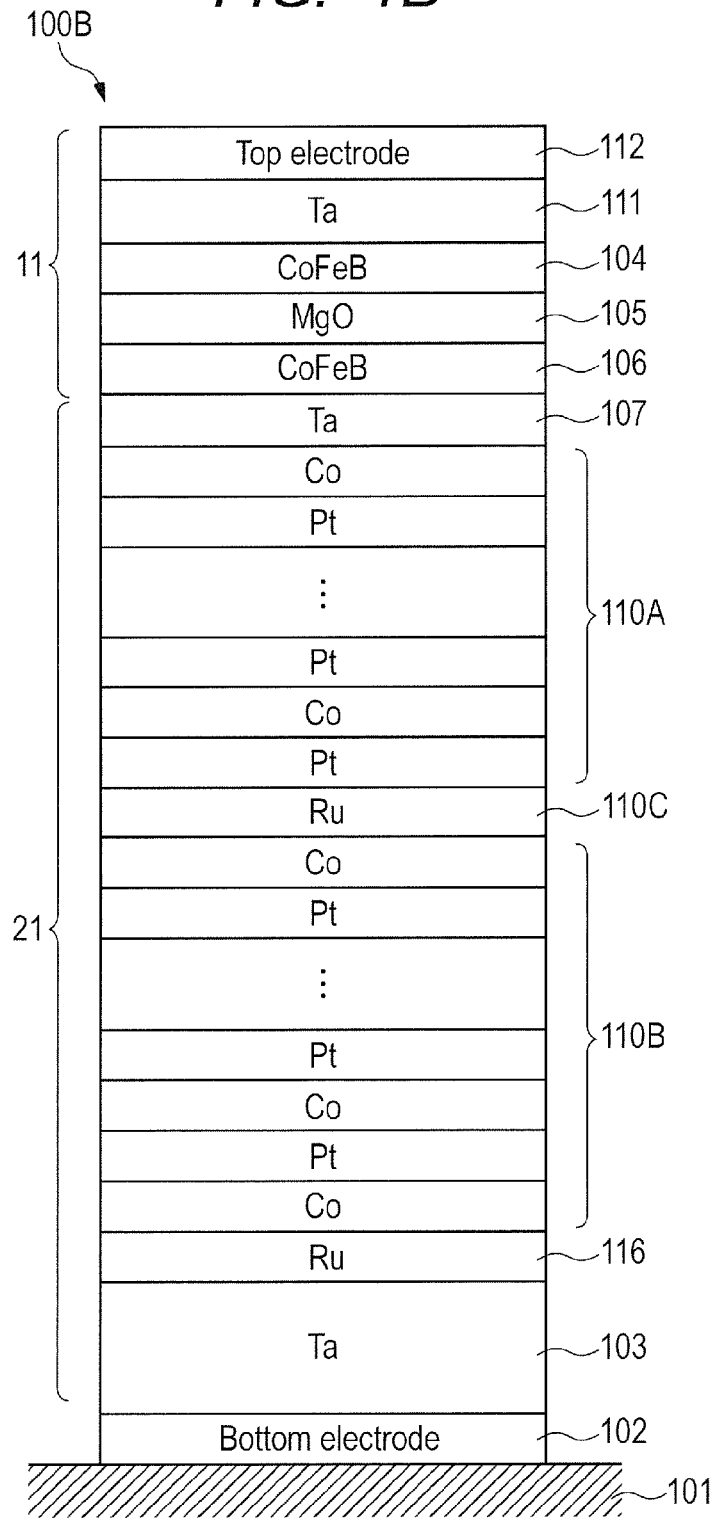
FIG. 1B is a schematic diagram illustrating a layer structure of a bottom-pinned perpendicular MTJ device.

FIGS. 1A and 1B are schematic diagrams illustrating a layered structure of a perpendicular MTJ device according to a first embodiment of the present invention. The thickness of each layer illustrated in the drawings is consistently schematic and does not suggest a relative thickness of each layer of a perpendicular MTJ device actually manufactured.

The perpendicular MTJ device includes a top-pinned perpendicular MTJ device 100A (FIG. 1A) and a bottom-pinned perpendicular MTJ device 100B (FIG. 1B).

A description is given of the top-pinned perpendicular MTJ device 100A illustrated in FIG. 1A. The top-pinned perpendicular MTJ device 100A includes a bottom electrode 102, a Ta layer (a seed layer) 103, a CoFeB layer 104 as a free layer (a magnetization free layer), a MgO layer (a tunnel barrier layer) 105, and a CoFeB layer 106 as a reference layer (a magnetization fixed layer), which are sequentially provided on a substrate 101 made of silicon or the like.

The top-pinned perpendicular MTJ device 100A further includes a Ta layer 107, superlattice [Co/Pt] multilayer 110A, an Ru layer 110C, superlattice [Co/Pt] multilayer 110B, an Ru layer 115 (a cap layer), a Ta layer 111, and a top electrode 112, which are sequentially provided on the CoFeB layer 106. The [Co/Pt] multilayers 110A and 110B include predetermined numbers of Co layers and Pt layers alternately stacked on each other. A Ru layer 110C is a layer to magnetically couple the upper [Co/Pt] multilayer 110B to the lower [Co/Pt] multilayer 110A.

The number of pairs of Co and Pt layers adjacent to each other in the [Co/Pt] multilayer 110A is three to five, and the number of pairs of Co and Pt layers adjacent to each other in the [Co/Pt] multilayer 110B is 8 to 15. The numbers of pairs are not limited to these values. Additionally, the [Co/Pt] multilayers 110A and 110B may be replaced with [Co/Pd] multilayers including Pd layers instead of the Pt layers. Moreover, the thicknesses of the Ta layer 103, CoFeB layer 104, MgO layer 105, CoFeB layer 106, and Ta layer 107 are 10 nm, 1.1 nm, 1 nm or less, 1.4 nm, and 0.3 nm, respectively.

The bottom-pinned perpendicular MTJ device 100B illustrated in FIG. 1B includes the same layers as those of the top-pinned perpendicular MTJ device 100A. The CoFeB layer 106 as a reference layer (a magnetization fixed layer) is provided on the side far from the substrate 101, and the multilayers 110B and 110A are therefore provided between the substrate 101 and CoFeB layer 106. Additionally, the bottom-pinned perpendicular MTJ device 100B further includes a Ru layer 116 as a seed layer under the multilayer 110B. The Ru layer 116 is a layer to improve the crystalline orientation of the [Co/Pt] multilayer 110B. The structures illustrated in FIGS. 1A and 1B are just examples, and the [Co/Pt] multilayers 110A and 110B may be made of materials having perpendicular magnetization. Instead of the [Co/Pt] multilayers 110A and 110B, TbFeCo, [Co/Ni] multilayers, CoPt or FePt, which are ordered alloys, or the like, may be used, for example.

The configurations of the perpendicular MTJ devices (of top-pinned and bottom-pinned types) according to the embodiment are not limited to the configurations illustrated herein and any change, such as increase or decrease in the number of layers, change in the constituent materials of the layers, and reversing the order of layers upside down, may be made as long as it does not degrade the functions of the perpendicular MTJ device.

Next, a description is given of separate film formation in the method of manufacturing the top-pinned perpendicular MTJ device 100A, which is a perpendicular MTJ device, using FIGS. 2A to 2D.

In the method of manufacturing the top-pinned perpendicular MTJ device 100A according to the embodiment, the part concerning a first stacked structure 10 of the top-pinned perpendicular MTJ device 100A is first formed on the substrate, and property inspection is performed. The part concerning a second stacked structure 20 of the top-pinned perpendicular MTJ device 100A is then formed, and different property inspection is performed. Herein, the first stacked structure 10 includes at least the CoFeB layer 104, MgO layer 105, and CoFeB layer 106, and the second stacked structure 20 includes at least the superlattice [Co/Pt] multilayers 110A and 110B.

To be specific, the first stacked structure 10 is formed on the substrate 101 under vacuum in a first film formation apparatus. The substrate with the first stacked structure 10 formed thereon is then taken out of the first film formation apparatus to be exposed to the atmosphere and is inspected in terms of the MR properties. The substrate is then etched back under vacuum in another second film formation apparatus, and the second stacked structure 20 is further formed on the same, producing the top-pinned perpendicular MTJ device 100A. The top-pinned perpendicular MTJ device 100A is then taken out of the second film formation apparatus and is inspected in terms of the perpendicular magnetic anisotropy properties.

Herein, the inspection of the MR properties is performed using a current in-plane tunneling (CIPT) measuring device or the like after a lower electrode layer necessary for the inspection is formed on the substrate with the first stacked structure 10 not yet formed thereon and then an upper electrode layer necessary for the inspection is formed on the substrate with the first stacked structure 10 formed thereon. The inspection of the perpendicular magnetic anisotropy properties is performed using a vibrating sample magnetometer (VSM) measuring device or the like. The property inspections are performed in a cleanroom with a low level of dust. The different second film formation apparatus does not need to be used if both of the first and second stacked structures 10 and 20 can be formed by only the first film formation apparatus to produce the top-pinned perpendicular MTJ device 100A.

Figure 2A:
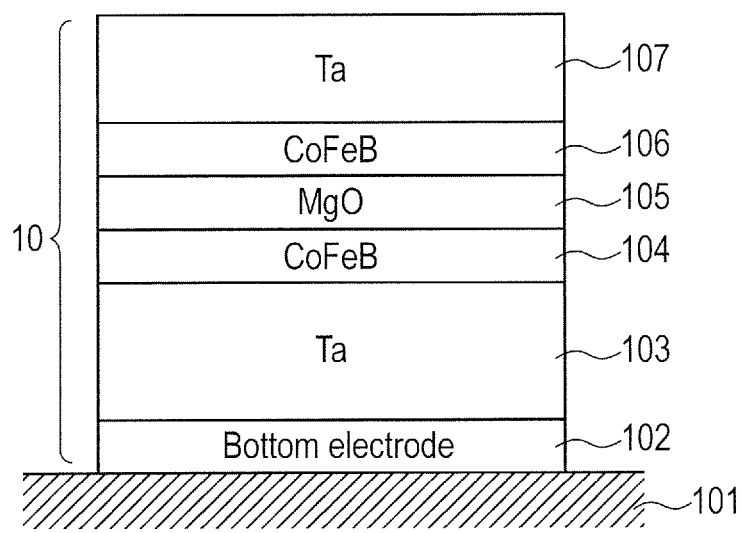
FIG. 2A is a schematic diagram illustrating separate film formation of the top-pinned perpendicular MTJ device.

The perpendicular MTJ device is separated into the first and second stacked structures 10 and 20 based on the Ta layer (also referred to as SpacerTa) 107. The separation may be based on another layer if the first stacked structure 10 includes at least the CoFeB layer 104, MgO layer 105, and CoFeB layer 106 and the second stacked structure 20 includes at least the superlattice [Co/Pt] multilayers 110A and 110B. As illustrated in FIG. 2A, the Ta layer 107 of the first stacked structure 10 needs to be made comparatively thick in light of partially removing the Ta layer 107 by etching. Controlling the thickness of each of the CoFeB layer 104, MgO layer 105, CoFeB layer 106, and superlattice [Co/Pt] multilayers 110A and 110B within 2 nm enables the perpendicular MTJ device to fulfill the function thereof. In the embodiment, the Ta layer 107 is formed into a thickness of about 3 nm at first and is then etched back to be controlled to 2 nm or less. However, the Ta layer 107 may be etched back by 1 nm or more.

The thickness of oxide film generated in the surface of the Ta layer 107 through exposure to the atmosphere depends on diffusion of oxygen into the Ta layer 107, which correlates to the time when the Ta layer 107 is left under the atmosphere, the atmosphere temperature, and the like. How thick the oxide film will be formed in the Ta layer 107 can be experimentally found based on the inspection time, environmental temperature, and the like of the property inspection after the treatment conducted in the first film formation apparatus. Accordingly, it is also experimentally found to what extent the Ta layer 107 needs to be removed in the etch-back process.

Figure 2B:
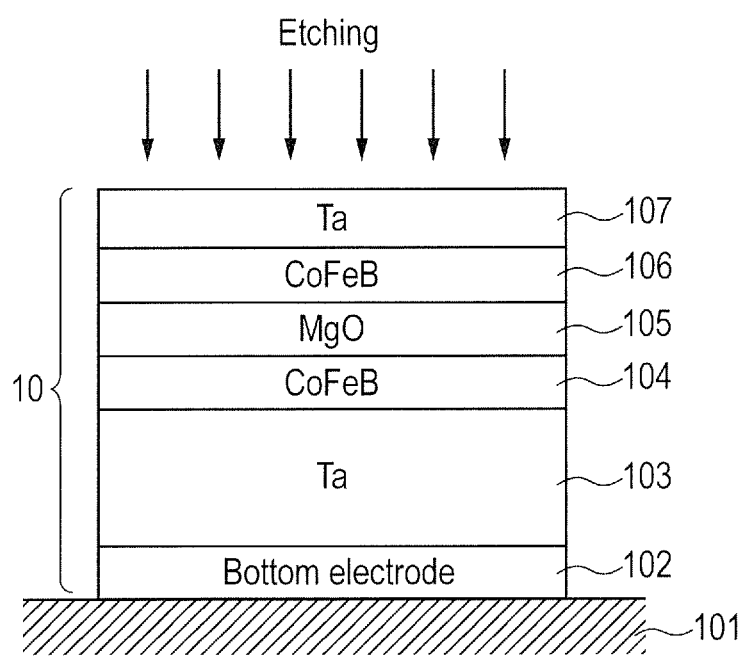
FIG. 2B is a schematic diagram illustrating separate film formation of the top-pinned perpendicular MTJ device.

As illustrated in FIG. 2B, after the process to etch a part of the Ta layer 107 (etch-back process), the second stacked structure 20 is formed starting from the Co layer of the

[Co/Pt] multilayer 110A, so that the top-pinned perpendicular MTJ device 100A illustrated in FIG. 1A is eventually produced.

To be specific, in the manufacture of the top-pinned perpendicular MTJ device 100A, the substrate on which the first stacked structure 10 is formed up to the Ta layer 107 under vacuum is taken out of the first film formation apparatus and is then inspected in terms of the MR properties in the cleanroom under the atmosphere. The substrate is then introduced into the second film formation apparatus, and a part (an oxidized part) of the Ta layer 107 is etched under vacuum (etch-back process). Thereafter, the upper layers are formed starting from a Co layer of the [Co/Pt] multilayer 110A. After the top electrode 112 is formed, the substrate is taken out of the second film formation apparatus and is inspected in terms of the perpendicular magnetic anisotropy properties.

Figure 2C:
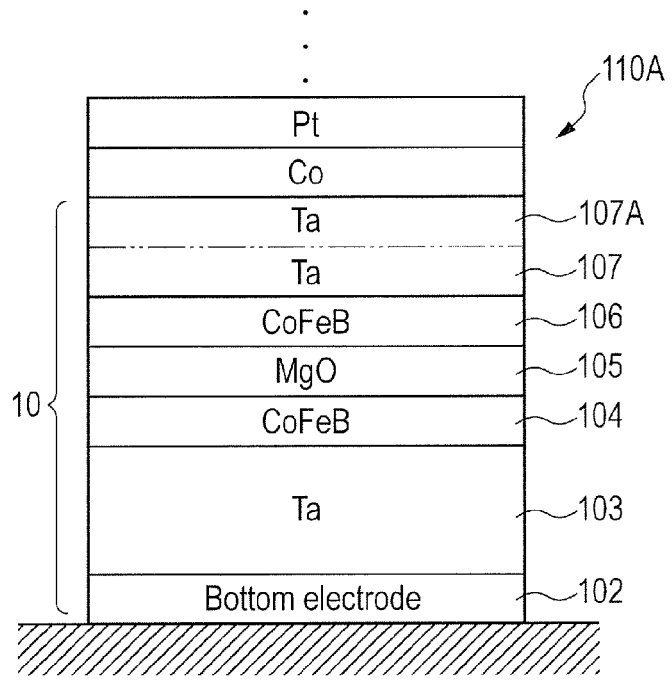
FIG. 2C is a schematic diagram illustrating separate film formation of the top-pinned perpendicular MTJ device.
Figure 2D:
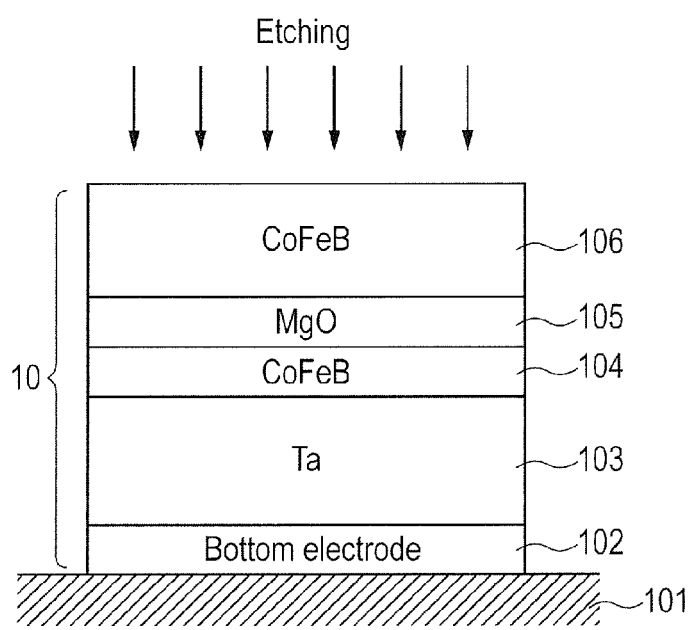
FIG. 2D is a schematic diagram illustrating separate film formation of the top-pinned perpendicular MTJ device.

Note that as illustrated in FIG. 2C, after a part of the Ta layer 107 is etched (etch-back process), the upper layers may be formed starting from a Ta layer 107A. Note that the Ta layers 107 and 107A are formed under the same film formation conditions using the same material. Alternatively, as illustrated in FIG. 2D, the CoFeB layer 106 may be made comparatively thick and the thus-obtained substrate is taken out of the first film formation apparatus and undergoes the property inspection. Thereafter, in the second film formation apparatus, a part of the CoFeB layer 106 is etched and the upper layers may be formed starting from the Ta layer 107.

Figure 3A:
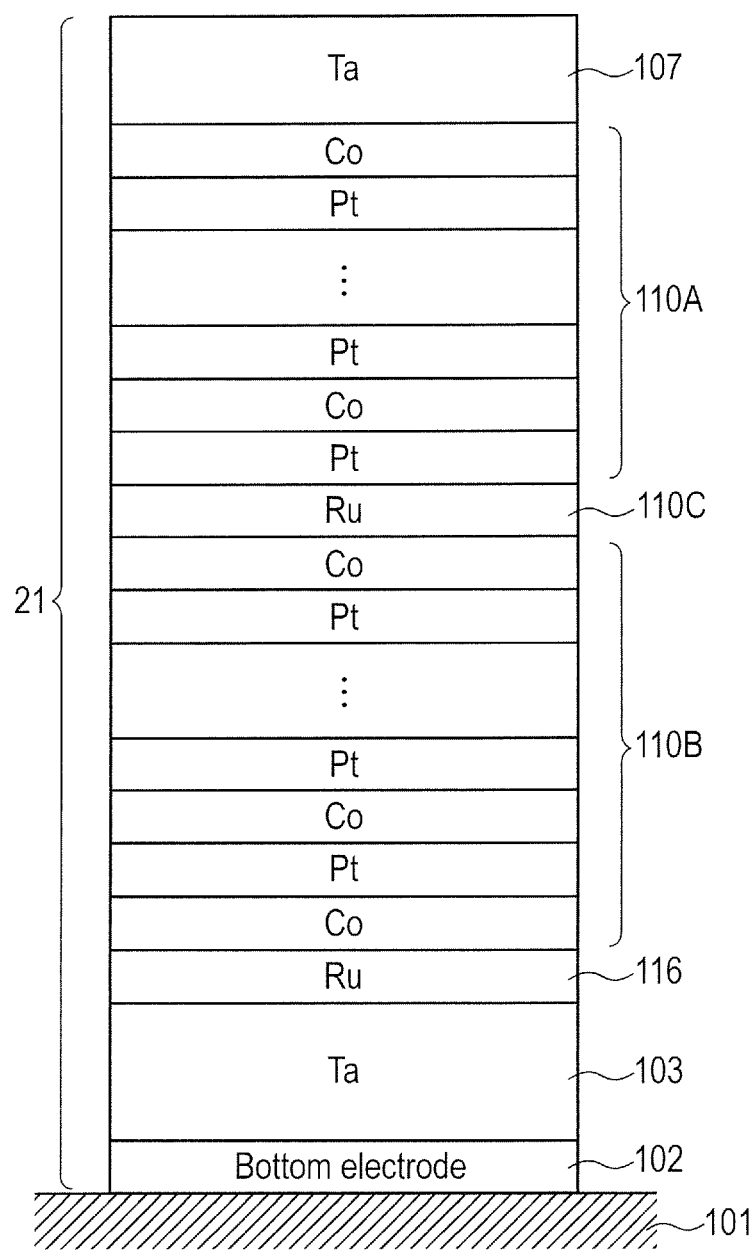
FIG. 3A is a schematic diagram illustrating separate film formation of the bottom-pinned perpendicular MTJ device.
Figure 3B:
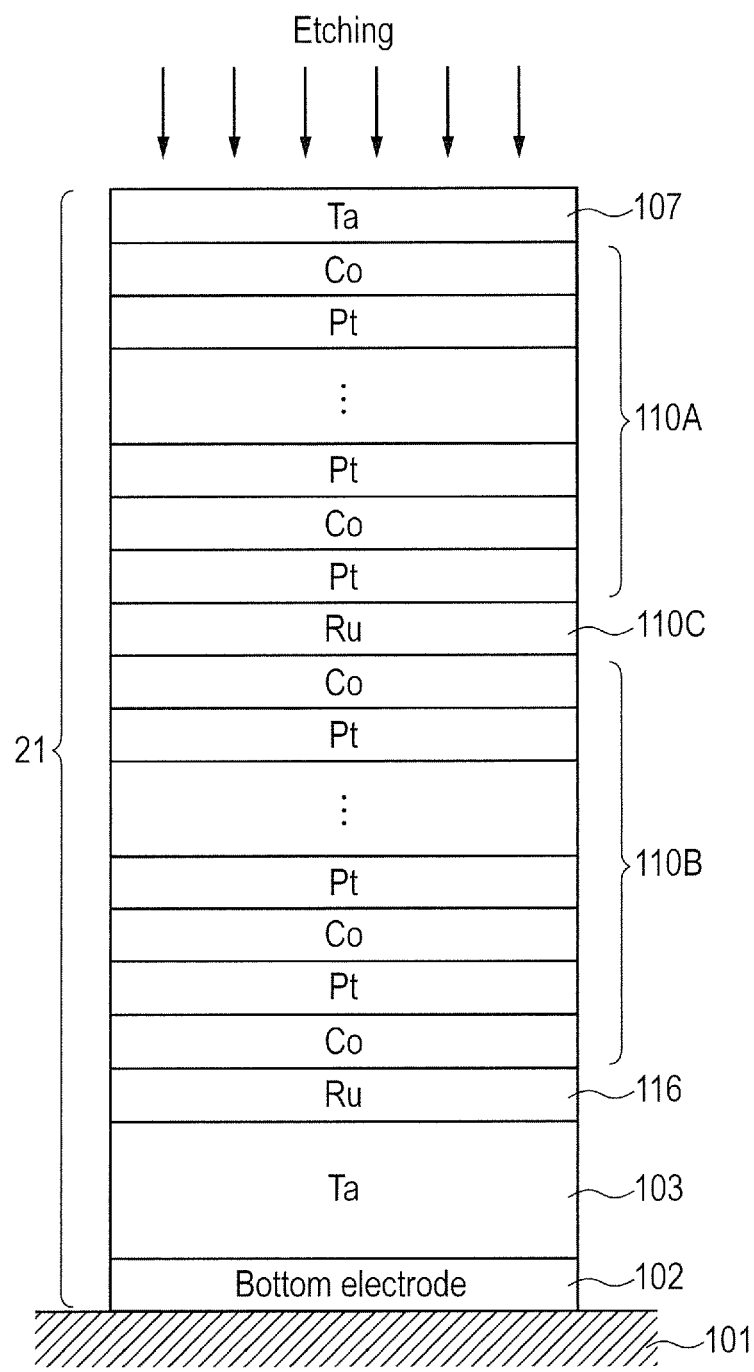
FIG. 3B is a schematic diagram illustrating separate film formation of the bottom-pinned perpendicular MTJ device.
Figure 3C:
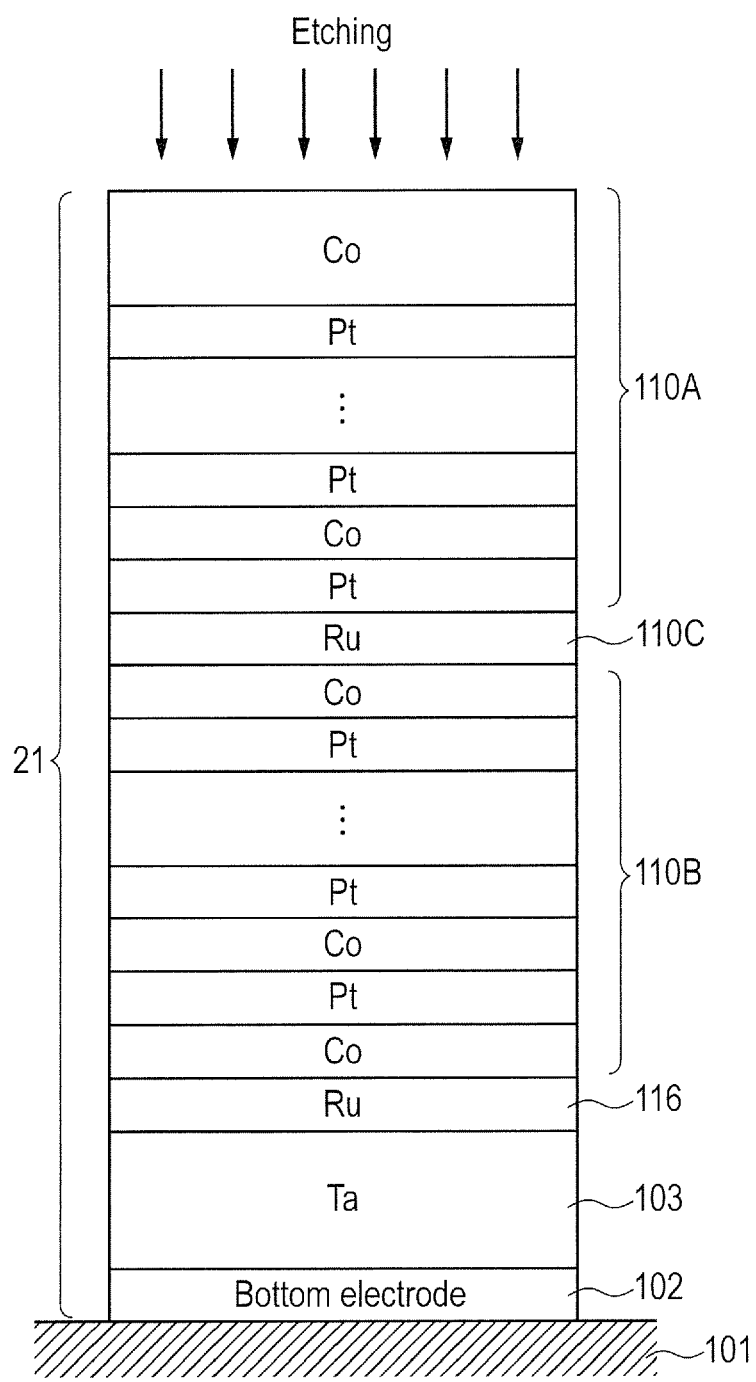
FIG. 3C is a schematic diagram illustrating separate film formation of the bottom-pinned perpendicular MTJ device.

Next, a description is given of separate film formation in the method of manufacturing the perpendicular MTJ device (the bottom-pinned perpendicular MTJ device 100B) using FIGS. 3A to 3C.

Similarly to the aforementioned method, in the method of manufacturing the bottom-pinned perpendicular MTJ device 100B according to the embodiment, the property inspection is performed after the part concerning the second stacked structure 21 of the bottom-pinned perpendicular MTJ device 100B is formed on the substrate, and the different property inspection is then performed after the part concerning the first stacked structure 11 of the bottom-pinned perpendicular MTJ device 100B is further formed. Herein, the first stacked structure 11 includes at least the CoFeB layer 104, MgO layer 105, and CoFeB layer 106, and the second stacked structure 21 includes at least the superlattice [Co/Pt] multilayers 110A and 110B.

The Ta layer 107 of the second stacked structure 21 is made comparatively thick as illustrated in FIG. 3A. After the process to etch a part of the Ta layer 107 (etch-back process) as illustrated in FIG. 3B, the first stacked structure 11 is formed starting from the CoFeB layer 106 of the first stacked structure 11, so that the bottom-pinned perpendicular MTJ device 100B illustrated in FIG. 1B is eventually produced.

In the manufacture of the bottom-pinned perpendicular MTJ device 100B illustrated in FIGS. 3A and 3B, the substrate on which the second stacked structure 21 is formed up to the Ta layer 107 is taken out of the first film formation apparatus and is then inspected in terms of the perpendicular magnetic anisotropy properties in the cleanroom under the atmosphere. The substrate is then introduced into the second film formation apparatus, and a part (an oxidized part) of the Ta layer 107 is etched under vacuum (the etch-back process). Thereafter, the upper layers are formed starting from the CoFeB layer 106. After the top electrode 112 is formed, the substrate is taken out of the second film formation apparatus and is inspected in terms of the MR properties.

As illustrated in FIG. 3C, after forming a Co layer that is the topmost layer of the [Co/Pt] multilayer 110A of the second stacked structure 21 comparatively thick, the substrate may be taken out of the first film formation apparatus and then be inspected for properties. Thereafter, the first stacked structure 11 is formed starting from the Ta layer 107 after a part of the Co layer is etched in the second film formation apparatus.

Figure 4:
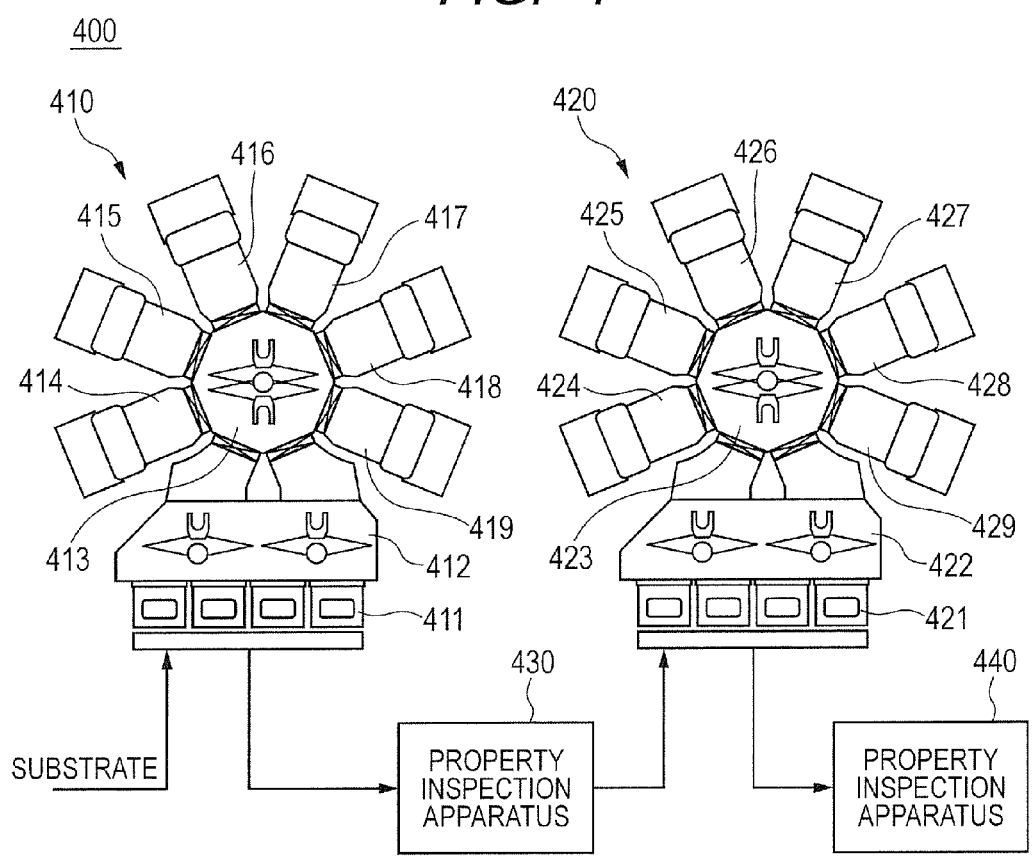
FIG. 4 is a schematic configuration diagram of a manufacturing system including a single-core sputtering apparatus.

FIG. 4 is a schematic configuration diagram of a manufacturing system 400 including single-core sputtering apparatuses 410 and 420 as the first and second film formation apparatuses used in the method of manufacturing a perpendicular MTJ device according to the embodiment.

In manufacture of the top-pinned perpendicular MTJ device 100A, the sputtering apparatus 410 is the first film formation apparatus to form the first stacked structure 10, and the sputtering apparatus 420 is the second film formation apparatus to form the second stacked structure 20. On the other hand, in manufacture of the bottom-pinned perpendicular MTJ device 100B, the sputtering apparatus 410 is the first film formation apparatus to form the second stacked structure 21, and the sputtering apparatus 420 is the second film formation apparatus to form the first stacked structure 11.

The manufacturing system 400 further includes property inspection apparatuses 430 and 440. In manufacture of the top-pinned perpendicular MTJ device 100A, the property inspection apparatus 430 is a CIPT measuring device for inspection of the MR properties, and the property inspection apparatus 440 is a VSM measuring device for inspection of the perpendicular magnetic anisotropy properties. On the other hand, in manufacture of the bottom-pinned perpendicular MTJ device 100B, the property inspection apparatus 430 is a VSM measuring device, and the property inspection apparatus 440 is a CIPT measuring device. The following description relates to the manufacturing system 400 for the top-pinned perpendicular MTJ device 100A unless otherwise noted. The manufacturing system 400 for the bottom-pinned perpendicular MTJ device 100B is the same as that for the top-pinned perpendicular MTJ device 100A other than the differences in the order of formed layers and target materials.

The sputtering apparatus 410 includes an equipment front end module (EFEM) 411, a load lock chamber 412, a vacuum transfer chamber 413, an etching chamber 414, metal deposition chambers 415 to 417, an oxidation chamber 418, and a degassing chamber 419. Each chamber is kept evacuated.

The EFEM 411 transports a substrate into and out of the load lock chamber 412. The load lock chamber 412 adjusts the inside of the chamber to vacuum and transports the substrate to the vacuum transfer chamber 413. The vacuum transfer chamber 413 includes a robot loader to load and unload the substrate to a robot feeder (not illustrated) within each chamber 414 to 419. The etching chamber 414 performs dry etching such as capacitively-coupled plasma (CCP) etching, inductively-coupled plasma (ICP) etching, or ion beam etching. In the metal deposition chambers 415 to 417, the target materials used to form the layers of the first stacked structure 10, such as a Ta target, a CoFeB target, and an Mg target, for example, are provided, and each layer is formed on the substrate by sputtering. The oxidation chamber 418 performs oxidation for the substrate.

The sputtering apparatus 420 includes an EFEM 421, a load lock chamber 422, a vacuum transfer chamber 423, an etching chamber 424, metal deposition chambers 425 to 428, and a degassing chamber 429. The inside of each chamber is kept evacuated. The EFEM 421, load lock chamber 422, vacuum transfer chamber 423, and degassing chamber 429 are the same as those of the sputtering apparatus 410. In the metal deposition chambers 425 to 428, the target materials used to form each layer of the second stacked structure 20, such as a Co target, a Pt target, a Ru target, and a Ta target, for example, are provided, and each layer is formed on the substrate by sputtering.

The substrate is transported between the sputtering apparatuses 410 and 420 and the property inspection apparatuses 430 and 440 through a transfer path (not illustrated) or by an operator.

Hereinafter, the embodiment is described in more detail. First, a substrate 101 is transported into the load lock chamber 412 through the EFEM 411 of the first film formation apparatus 410. The robot loader of the vacuum transfer chamber 413 is then driven to sequentially move the substrate from the load lock chamber 412 to the predetermined substrate treatment chambers 414 to 419, thus forming the first stacked structure 10 (or the second stacked structure 21).

In manufacture of the top-pinned perpendicular MTJ device 100A, etching is performed in the first film formation apparatus 410 to remove impurities and the like attached to the substrate 101. Thereafter, the bottom electrode 102, Ta layer 103, CoFe layer 104, MgO layer 105, CoFeB layer 106 as the reference layer, and Ta layer 107 are sequentially formed on the substrate 101 by sputtering, thus forming the first stacked structure 10.

On the other hand, in manufacture of the bottom-pinned perpendicular MTJ device 100B, etching is performed in the first film formation apparatus 410 to remove impurities and the like attached to the substrate 101. Thereafter, the bottom electrode 102, Ta layer 103, and the multilayers 110A and 110B are sequentially formed on the substrate 101 by sputtering, thus forming the second stacked structure 21.

Next, the substrate is ejected from the first film formation apparatus 410 through the load lock chamber 412 and EFEM 411 to be exposed to the atmosphere. The substrate then undergoes the property inspection (the inspection of the MR properties or perpendicular magnetic anisotropy properties) in the property inspection apparatus 430. Thereafter, the substrate is transferred into the load lock chamber 422 through the EFEM 421 of the second film formation apparatus 420. The robot loader of the vacuum transfer chamber 423 is driven to move the substrate from the load lock chamber 422 sequentially to the predetermined substrate treatment chambers 424 to 429, thus forming the second stacked structure 20 (or the first stacked structure 11).

In the manufacture of the top-pinned perpendicular MTJ device 100A, etching is performed to remove impurities attached to the Ta layer 107, oxide film formed in the Ta layer, and the like in the second film formation apparatus 420. Thereafter, the multilayer 110A, Ru layer 110C, multilayer 110B, Ru layer 115, Ta layer 111, and top electrode 112 are sequentially formed by sputtering. On the other hand, in the manufacture of the bottom-pinned perpendicular MTJ device 100B, etching is performed to remove impurities attached to the Ta layer 107, oxide film formed in the Ta layer, and the like in the second film formation apparatus 420. Thereafter, the CoFe layer 106, MgO layer 105, CoFeB layer 104, Ta layer 111, and top electrode 112 are sequentially formed by sputtering. The eventually formed top-pinned perpendicular MTJ device 100A (or bottom-pinned perpendicular MTJ device 100B) is ejected from the second film formation apparatus 420 and is then inspected in terms of the perpendicular magnetic anisotropy properties (or the MR properties) in the property inspection apparatus 440.

The MgO layer 105 may be formed by radio-frequency (RF) sputtering using an MgO target or may be formed in such a manner that an Mg layer is formed on the CoFeB layer by sputtering using an Mg target and is then oxidized. The film formation and oxidation of Mg may be performed in the same substrate treatment chamber of the first film formation apparatus 410 (or the second film formation apparatus 420) or may be performed in different substrate treatment chambers that use a metal deposition chamber and an oxidation chamber.

Figure 5:
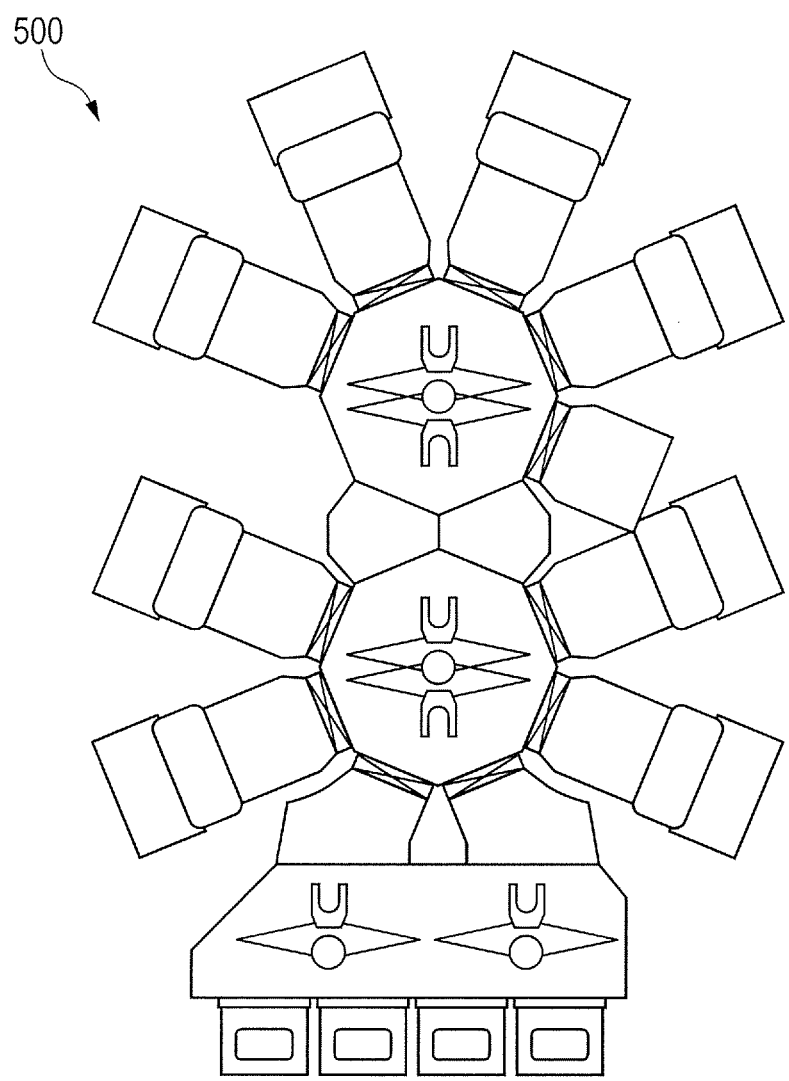
FIG. 5 is a schematic configuration diagram of a double-core sputtering apparatus.

The film formation apparatus used in the method of manufacturing a perpendicular MTJ device may be a double-core sputtering apparatus 500 as illustrated in FIG. 5. The double-core sputtering apparatus 500 can also implement the method of manufacturing a perpendicular MTJ device according to the embodiment. By using the double-core sputtering apparatus 500, the number of chambers capable of performing deposition per film formation apparatus is increased, and more perpendicular MTJ devices can be manufactured than manufactured by the single-core sputtering apparatus.

FIG. 6 is a flowchart for explaining the method of manufacturing the top-pinned perpendicular MTJ device 100A, which is the perpendicular MTJ device according to the embodiment.

In S601, the bottom electrode 102, Ta layer 103, CoFeB layer 104, MgO layer 105, CoFeB layer 106, and Ta layer 107 are sequentially formed on the substrate 101 in the first film formation apparatus 410, thus forming the first stacked structure 10. As described above, the first stacked structure 10 may be formed in such a manner that the CoFeB layer 106 is made comparatively thick and the Ta layer 107 is not formed as the first stacked structure 10 but formed as the second stacked structure 20.

In S602, the substrate with the first stacked structure 10 formed thereon is taken out of the first film formation apparatus 410 to be exposed to the atmosphere, and the electrode layer and the like necessary for the property inspection are formed thereon. In S603, inspection of the MR properties is performed in the property inspection apparatus 430, which is a CIPT measuring device. Accordingly, the property inspection is performed for the substrate with only the first stacked structure 10 formed thereon before the second stacked structure 20 is formed. This facilitates management of the properties attributed to the first stacked structure 10.

Next, in step S604, etching is performed in the second film formation apparatus 420 after the property inspection for the first stacked structure 10 is completed because the topmost layer (the Ta layer 107 or CoFeB layer 106) of the first stacked structure 10 has been exposed to the atmosphere and naturally oxidized. The etching is dry etching using Ar gas, such as capacitively-coupled plasma (CCP) etching, inductively-coupled plasma (ICP) etching, or ion beam etching, for example.

In S605, the multilayer 110A, Ru layer 110C, multilayer 110B, Ru layer 115, Ta layer 111, and top electrode 112 (in addition, the Ta layer 107 if necessary) are formed in the second film formation apparatus 420, thus forming the second stacked structure 20. Since the property inspection (MR properties) for the first stacked structure 10 is already performed, in 5606, inspection of the properties different from the MR properties, that is, perpendicular magnetic anisotropy properties, is performed in the property inspection apparatus 440, which is a VSM measuring device, after the second stacked structure 20 is formed.

FIG. 7 is a flowchart for explaining the method of manufacturing the bottom-pinned perpendicular MTJ device 100B, which is the perpendicular MTJ device according to the embodiment.

In S701, the bottom electrode 102, Ta layer 103, Ru layer 106, multilayer 110B, Ru layer 110C, multilayer 110A, and Ta layer 107 are sequentially formed on the substrate 101 in the first film formation apparatus 410, thus forming the second stacked structure 21. As described above, the second stacked structure 21 may be formed in such a manner that the Co layer at the topmost layer of the multilayer 110A is made comparatively thick and the Ta layer 107 is not formed as the second stacked structure 21 but formed as the first stacked structure 11.

In S702, the substrate with the second stacked structure 21 formed thereon is taken out of the first film formation apparatus 410 to be exposed to the atmosphere, and the electrode layer and the like necessary for the property inspection are formed thereon. In S703, inspection of the perpendicular magnetic anisotropy properties is performed in the property inspection apparatus 430, which is a VSM measuring device. The property inspection is thus performed for the substrate with only the second stacked structure 21 formed thereon before the first stacked structure 11 is formed. This facilitates management of the properties attributed to the second stacked structure 21.

Next, in step S704, etching is performed in the second film formation apparatus 420 after the property inspection for the second stacked structure 21 is completed because the topmost layer (the Ta layer 107 or Co layer) of the second stacked structure 21 has been exposed to the atmosphere and naturally oxidized. The etching is dry etching using Ar gas, such as capacitively-coupled plasma (CCP) etching, inductively-coupled plasma (ICP) etching, or ion beam etching, for example.

In S705, the CoFeB layer 106, MgO layer 105, CoFeB layer 104, Ta layer 111, and top electrode 112 (in addition, the Ta layer 107 if necessary) are formed in the second film formation apparatus 420, thus forming the first stacked structure 11. Since the property inspection for the second stacked structure 21 (perpendicular magnetic anisotropy properties) is already performed, in 5706, inspection of the MR properties is performed in the property inspection apparatus 440, which is a CIPT measuring device, after the first stacked structure 11 is formed.

As described above, by separately performing the property inspections for the perpendicular MTJ device in the middle and after manufacture thereof, inspection of the MR properties is performed when the first stacked structure including the CoFeB layer 104, MgO layer 105, and CoFeB layer 106 is formed, and inspection of the perpendicular magnetic anisotropy properties is performed when the second stacked structure including the multilayers 110A and 110B is formed. Accordingly, in order that products (the substrates with only the first or second stacked structure formed thereon or the substrates with the first and second stacked structures formed) by the apparatuses that form the first and second stacked structures have desired properties, it is only necessary to adjust the conditions of each apparatus (control conditions of sputtering and the like), the film thickness and the material type of each layer, and the like. This clarifies the roles of the apparatuses and simplifies the management of the properties of perpendicular MTJ devices.

For example, the perpendicular magnetic anisotropy properties are guaranteed only by controlling the thickness of each layer at forming the second stacked structure, and the second stacked structure can be formed even if the film formation apparatus to form the first stacked structure is malfunctioning. Moreover, by increasing the number of modules performing substrate treatment in each apparatus used in film formation, the throughput can be increased. For example, using the double-core sputtering apparatus 500 illustrated in FIG. 5 can double the throughput compared with the single-core sputtering apparatus 410 or 420 illustrated in FIG. 4.

In the conventional method, property inspections of both the MR properties and perpendicular magnetic anisotropy properties are performed for a perpendicular MTJ device with both the first and second stacked structures formed thereon. Accordingly, in the case where the MR properties attributed to the first stacked structure are different from desired values, for example, the entire perpendicular MTJ device needs to be discarded even if the perpendicular magnetic anisotropy properties attributed to the second stacked structure are normal. The film formation treatment to form the second stacked structure is wasted, resulting in cost of production loss. However, according to the method of manufacturing a perpendicular MTJ device according to the embodiment, in case of trouble of film formation apparatuses, it is possible to determine that the apparatus which has formed the first stacked structure is malfunctioning when the MR properties include a problem, or it is possible to determine that the apparatus which has formed the second stacked structure is malfunctioning when the perpendicular magnetic anisotropy properties include a problem. It is therefore possible to easily identify the cause of the malfunctioning apparatus, thus reducing the cost of production loss in case of trouble.

(Other Embodiment)

The method of manufacturing a perpendicular MTJ device according to the present invention is not limited to manufacture of perpendicular MTJ devices including the configurations illustrated in FIGS. 1A and 1B and is applicable to manufacture of any type of perpendicular MTJ devices. Using the manufacturing method according to the present invention can reduce the cost concerning controlling the conditions of the film formation apparatus for perpendicular MTJ devices having desired properties.

The invention claimed is:

1. A method of manufacturing a perpendicular MTJ device comprising:
   a first stacked structure including a pair of CoFeB layers sandwiching an MgO layer; and
   a second stacked structure including a multilayer,
   the method comprising the steps of:
   forming one of the first and second stacked structures on a substrate;
   inspecting one of a perpendicular magnetic anisotropy property and an MR property of the substrate with the one of the first and second stacked structures formed thereon while removing the substrate from vacuum and exposing the substrate to an atmosphere;
   etching a part of a topmost layer of the one of the first and second stacked structures; and
   forming an other one of the first and second stacked structures on the substrate with the one of the first and second stacked structures formed thereon.

2. The method according to claim 1, wherein the topmost layer is any one of a Ta layer and one of the CoFeB layers included in the first stacked structure.

3. The method according to claim 1, wherein the topmost layer is any one of a Ta layer and a Co layer of the multilayer which is included in the second stacked structure.

* * * * *